United States Patent [19]
Liaw

[11] Patent Number: 5,930,633
[45] Date of Patent: Jul. 27, 1999

[54] INTEGRATED BUTT-CONTACT PROCESS IN SHALLOW TRENCH ISOLATION

[75] Inventor: Jhon-Jhy Liaw, Taipei, Taiwan

[73] Assignee: Taiwan Semiconductor Manufacturing Company, Ltd., Hsin-Chu, Taiwan

[21] Appl. No.: 08/898,975

[22] Filed: Jul. 23, 1997

[51] Int. Cl.[6] ............................. H01L 21/76; H01L 21/28
[52] U.S. Cl. ...................... 438/296; 438/223; 438/233; 438/430; 438/586; 438/637; 438/669
[58] Field of Search ..................................... 438/223, 224, 438/233, 296, 424, 430, 586, 618, 622, 637, 669, FOR 227, FOR 346, FOR 347, FOR 363

[56] References Cited

U.S. PATENT DOCUMENTS

| | | |
|---|---|---|
| 5,350,712 | 9/1994 | Shibata . |
| 5,494,848 | 2/1996 | Chin . |
| 5,525,552 | 6/1996 | Huang . |
| 5,607,881 | 3/1997 | Huang . |
| 5,624,862 | 4/1997 | An . |
| 5,843,816 | 12/1998 | Liaw et al. . |

OTHER PUBLICATIONS

S. Wolf, "Silicon Processing For The VLSI Era–vol. 2", Lattice Press, Sunset Beach, CA, 1990, pp. 160–162.

*Primary Examiner*—George Fourson
*Attorney, Agent, or Firm*—George O. Saile; Stephen B. Ackerman; Rosemary L.S. Pike

[57] ABSTRACT

A new method of forming a butted contact in combination with a shallow trench isolation process is described. Shallow trench isolation areas are formed within the semiconductor substrate and filled with an oxide. A first photomask is formed having an opening larger than the butted contact to be formed and exposing a portion of at least one of the shallow trench isolation areas. The oxide is etched away within the shallow trench isolation area where it is exposed forming a misalignment trench wherein the exposed sidewall is adjacent to a P-well. A gate oxide layer is grown on the surface of the substrate and on the exposed sidewall of the misalignment trench. A first polysilicon layer is deposited overlying the gate oxide layer and filling the misalignment trench. The polysilicon and oxide layers are etched away to form gate electrodes and interconnection lines where a portion of the first polysilicon layer remains within the misalignment trench. A dielectric layer is deposited overlying the gate electrodes and lines. A second photomask is formed overlying the dielectric layer having an opening where the butted contact is to be made. The dielectric layer is etched away within the opening. A second layer of polysilicon is deposited within the opening to form a butted contact wherein the presence of the gate oxide layer within the misalignment trench prevents a short between the first and second polysilicon layers within the misalignment trench and the adjacent substrate.

20 Claims, 16 Drawing Sheets

INTEGRATED BUTT-CONTACT PROCESS IN SHALLOW TRENCH ISOLATION

BACKGROUND OF THE INVENTION (1) Field of the Invention

The invention relates to the fabrication of integrated circuit devices, and more particularly, to a method of avoiding shorting of a butted contact in a shallow trench isolation process in the fabrication of integrated circuits.

(2) Description of the Prior Art

As the design rule is reduced for high density memories, shallow trench isolation (STI) has been gaining popularity to replace the traditional local oxidation of silicon (LOCOS) isolation process in separating active areas. Semiconductor device structures, such as gate electrodes and source and drain regions are formed in the active areas. FIG. 1 illustrates active regions separated by a shallow trench isolation region 12. In an active region, a P-well 14 as been formed in the semiconductor substrate 10. A gate electrode 16 and polysilicon interconnection line 17 have been fabricated on the surface of the substrate and source/drain regions 18 associated with the gate electrode 16 are formed. An oxide layer 20 is deposited overlying the polysilicon lines. A contact opening 22 is etched through the oxide layer to one of the source/drain regions 18. A butted contact is to be made here. The contact window overlaps both the polysilicon line and the substrate. Polysilicon layer 24 is deposited to fill the contact window thereby electrically strapping the two regions together. Butted contacts are described in *Silicon Processing for the VLSI Era,* Vol. 2, by Stanley Wolf, Lattice Press, CA, c. 1990, p. 160. If there is misalignment of the mask during etching of the polysilicon 16 and 17, the butted contact may be shorted to the P-well. If the mask is shifted to the left, as shown in FIG. 2, a portion of the STI 12 will be exposed. During etching to form the contact opening 22, a trench will be etched into the STI 12. This will cause a short 26 from the polysilicon 24 within the misalignment trench to the P-well area 14.

The problem of a short between the butted contact and the P-well does not occur in the case where Field OXide (FOX) isolation 11 is used, as illustrated in FIG. 3. Typically, source/drain junctions 18 are deeper than the FOX regions so that the shorting would not occur. If the junctions are not deeper than the FOX regions, an implant 28 can be added to prevent a short to the P-well. An implant cannot be added in the STI case because the sidewall profile of the trench is too sharp.

U.S. Pat. No. 5,350,712 to Shibata teaches the use of an additional metal width around a metal line to overcome mask misalignment problems causing etching of the semiconductor substrate. U.S. Pat. No. 5,494,848 to Chin teaches a method using an inverse tone of the buried contact mask to make a photoresist mask covering the buried junction area and adding an additional bias on either side of the mask to protect the buried junction area during overetch so that a misalignment of the mask will not cause the formation of a buried contact trench. U.S. Pat. No. 5,525,552 to Huang uses a high dielectric constant spacer material for the LDD spacer to provide better immunity of the buried contact trench. semiconductor substrate. U.S. Pat. No. 5,607,881 to Huang teaches linking the buried contact junction and the source junction by an extra high dosage N+ implant to overcome the disadvantages of a buried contact trench. Allowed U.S. patent application Ser. No. 08/621,273 (TSMC95-177) to M. S. Liang et al filed on Mar. 25, 1996 teaches the use of protective TEOS sidewall spacers in SRAM technology. Co-pending U.S. patent application Ser. No. 08/668,801 (TSMC95-176) to C. Y. Shi et al filed on Jun. 24, 1996 teaches the use of TEOS sidewall spacers to prevent the formation of a buried contact trench. Most of the prior art teaches misalignment trench avoidance or overcoming problems caused by these trenches in the case of buried contacts. Misalignment trenches within STI are not addressed.

SUMMARY OF THE INVENTION

A principal object of the present invention is to provide an effective and very manufacturable method of forming a butted contact in combination with a shallow trench isolation process.

Another object of the present invention is to provide a method of forming a butt contacted in combination with a shallow trench isolation process which will not be shorted if there is mask misalignment.

In accordance with the objects of this invention a new method of forming a butted contact in combination with a shallow trench isolation process is achieved. Shallow trench isolation areas are formed within the semiconductor substrate wherein the shallow trench isolation areas are filled with an oxide. A P-well is formed in the semiconductor substrate in one of the active areas. A first photoresist mask is formed over the surface of the semiconductor substrate having an opening where the butted contact will be formed wherein the opening is larger than the butted contact to be formed and wherein a portion of at least one of the shallow trench isolation areas is exposed. The oxide is etched away within the shallow trench isolation area where it is exposed whereby one sidewall of the shallow trench isolation areas is exposed and whereby a misalignment trench is formed within the shallow trench isolation area and wherein the exposed sidewall is adjacent to the P-well. The first photoresist mask is removed. A gate oxide layer is grown on the surface of the semiconductor substrate and on the exposed sidewall of the misalignment trench. A first polysilicon layer is deposited overlying the gate oxide layer and filling the misalignment trench. A second photoresist mask is formed overlying the semiconductor substrate. The first polysilicon and gate oxide layers are etched away where they are not covered by the second photoresist mask to form gate electrodes and interconnection lines wherein a portion of the first polysilicon layer remains within the misalignment trench and wherein the gate oxide layer on the sidewall is covered by the first polysilicon layer. The second photoresist mask is removed. Source and drain regions are formed within the semiconductor substrate adjacent to the gate electrodes. A first dielectric layer is deposited overlying the gate electrodes and interconnection lines. A third photoresist mask is formed overlying the first dielectric layer having an opening where the butted contact is to be made wherein said third photoresist mask is smaller than said first photoresist mask. The first dielectric layer is etched away within the opening. The third photoresist mask is removed. A second layer of polysilicon is deposited over the first dielectric layer and within the opening to form a butted contact wherein the presence of the gate oxide layer within the misalignment trench prevents a short between the first and second polysilicon layers within the misalignment trench and the adjacent P-well completing the formation of a butted contact in the fabrication of an integrated circuit device.

BRIEF DESCRIPTION OF THE DRAWINGS

In the accompanying drawings forming a material part of this description, there is shown:

FIGS. 5A through 14A schematically illustrate in cross-sectional representation a preferred embodiment of the present invention showing a first view across FIG. 4.

FIGS. 5B through 14B schematically illustrate in cross-sectional representation a preferred embodiment of the present invention showing a second view across FIG. 4.

FIGS. 5C and 9C through 14C schematically illustrate in cross-sectional representation a preferred embodiment of the present invention showing a third view across FIG. 4.

DESCRIPTION OF THE PREFERRED EMBODIMENTS

It should be understood that this invention is not limited to the embodiment of FIGS. 5 through 15 wherein an N channel MOSFET integrated circuit device is illustrated. It is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 5A:
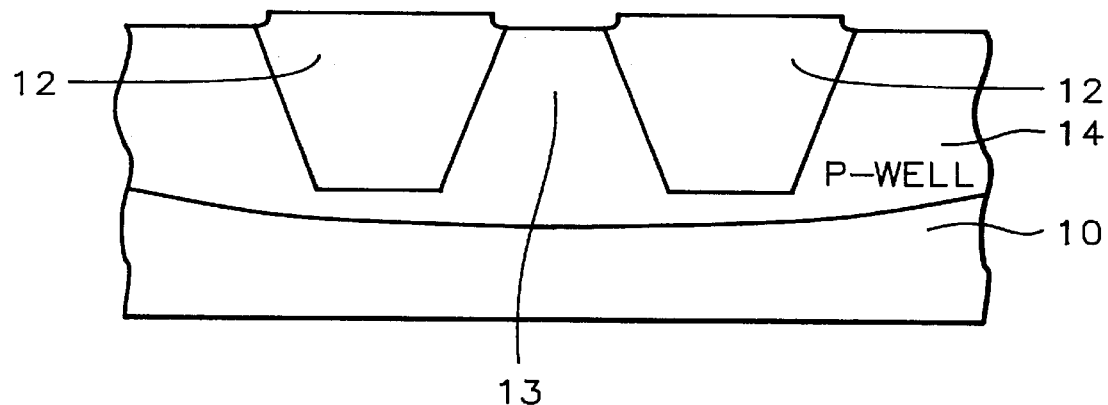
Figure 5B:
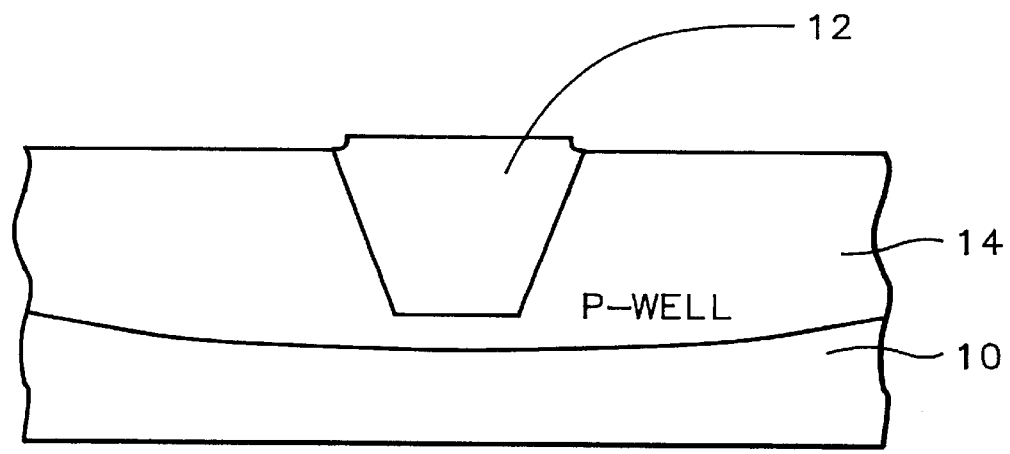
Figure 5C:
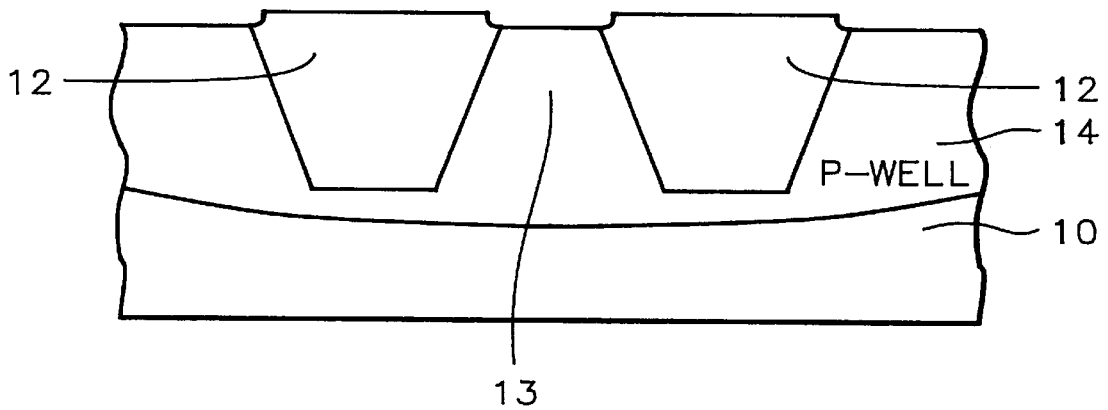

Referring now more particularly to FIGS. 5A, 5B, and 5C, there is shown a portion of a partially completed integrated circuit. There is shown a monocrystalline semiconductor substrate 10 in which there are formed shallow trench isolation (STI) regions 12. The STI regions are formed by etching trenches into the semiconductor substrate to a depth of between about 3000 to 5000 Angstroms and filling the trenches with an oxide layer.

P-well 14 may be formed as is conventional in the art and as shown in the figures. N-wells may also be formed in other active areas of the substrate, not shown. In subsequent figures, the P-well will not be shown as it is unnecessary to the process of the invention.

Figure 1:
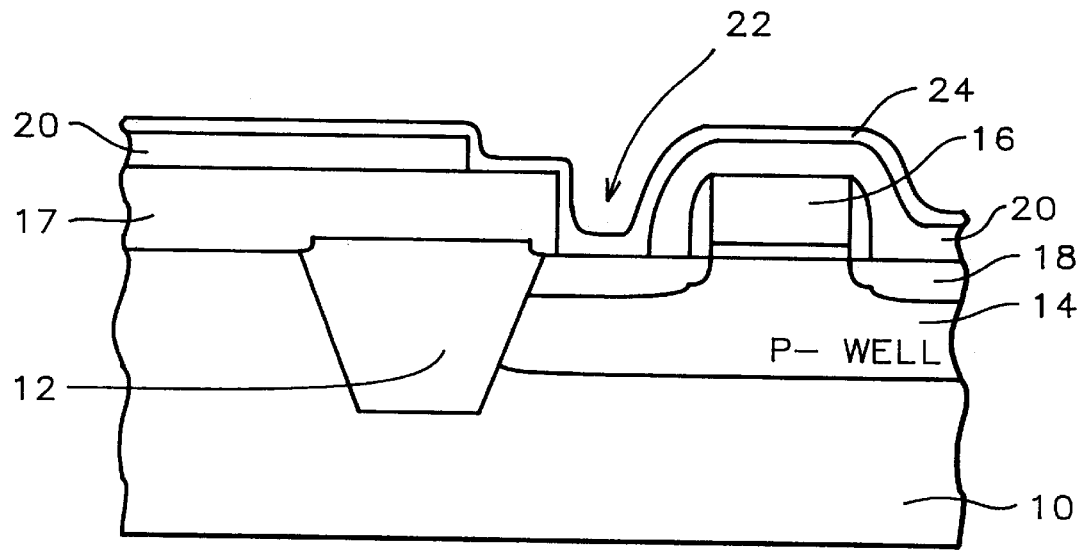
FIGS. 1 through 3 schematically illustrate in cross-sectional representation embodiments of the prior art.
Figure 2:
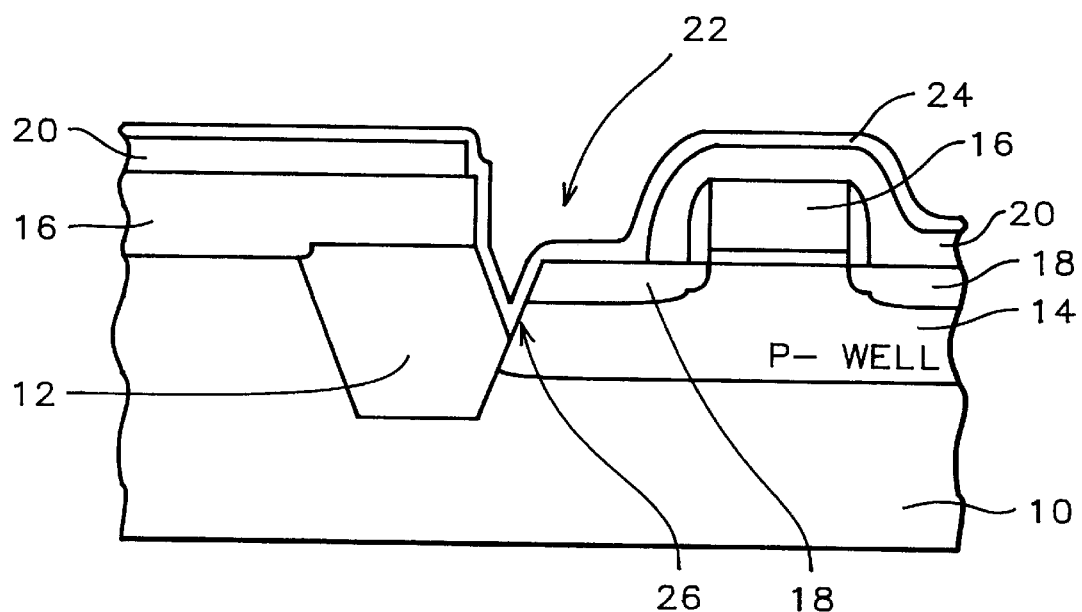
Figure 3:
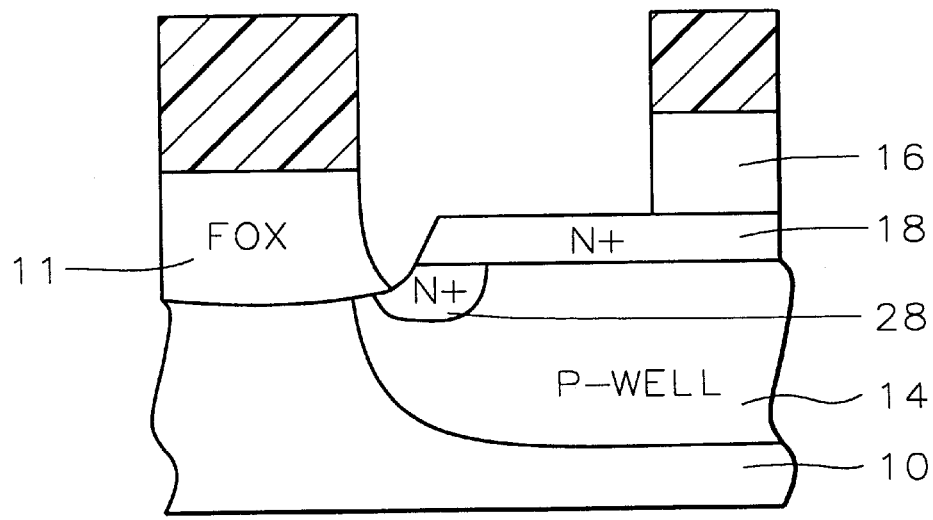
Figure 4:
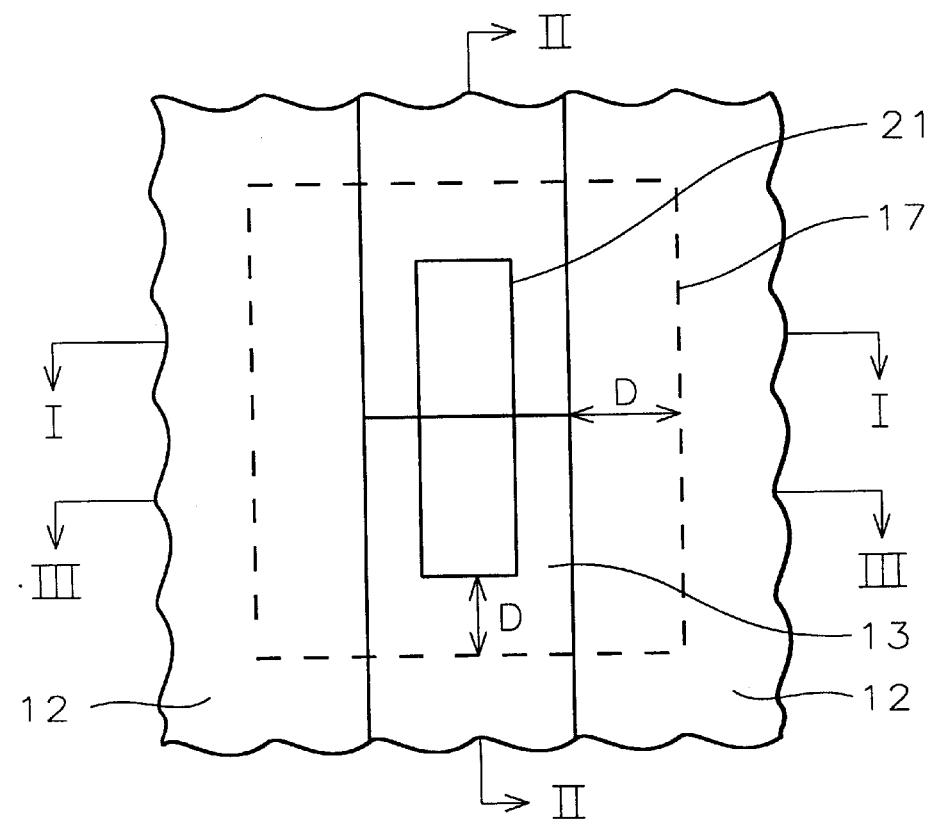
FIG. 4 illustrates in top view a butted contact of the present invention.

In the present invention, an extension butted contact photolithographic etch is added to the process at this point. FIG. 4 illustrates a top view of the butted contact region. Active area 13 is shown flanked by shallow trench isolation areas 12. The butted contact opening to be formed is shown by 21. The extension butted contact opening, shown by 17, is larger than the butted contact opening 21 by length D, which is between about 0.15 to 0.2 micron.

FIGS. 5A, 5B, and 5C, and subsequent figures show views A—A, B—B, and C—C, respectively, of FIG. 4. View C—C is the same as View A—A in FIGS. 5C and 5A. View C—C will be shown only if it is different from view A—A.

Figure 6A:
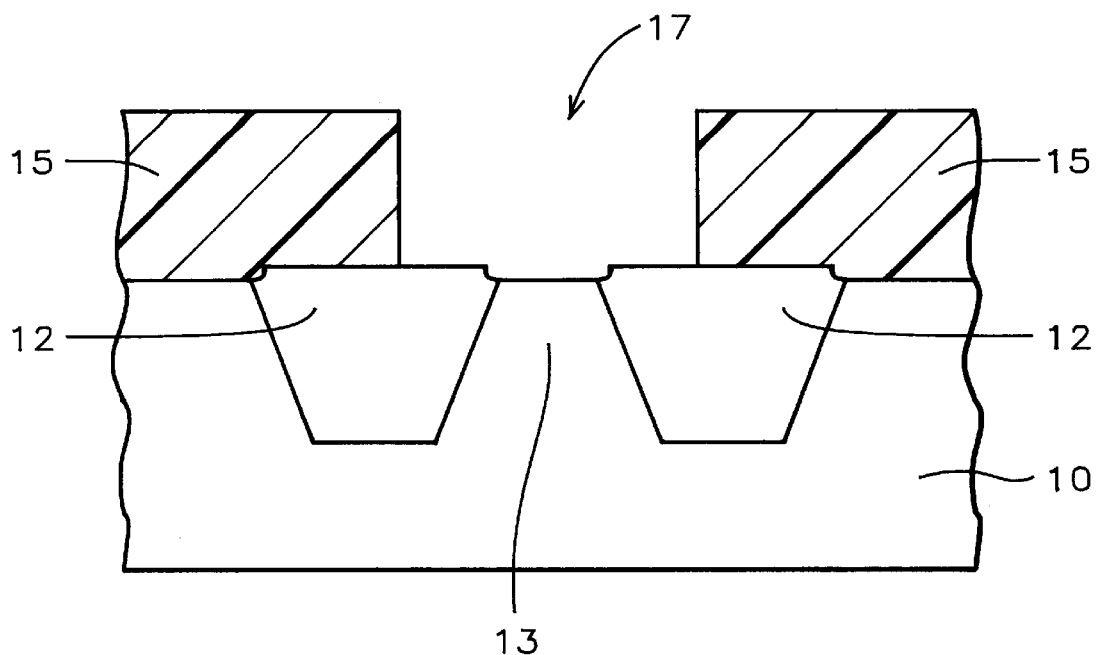
Figure 6B:
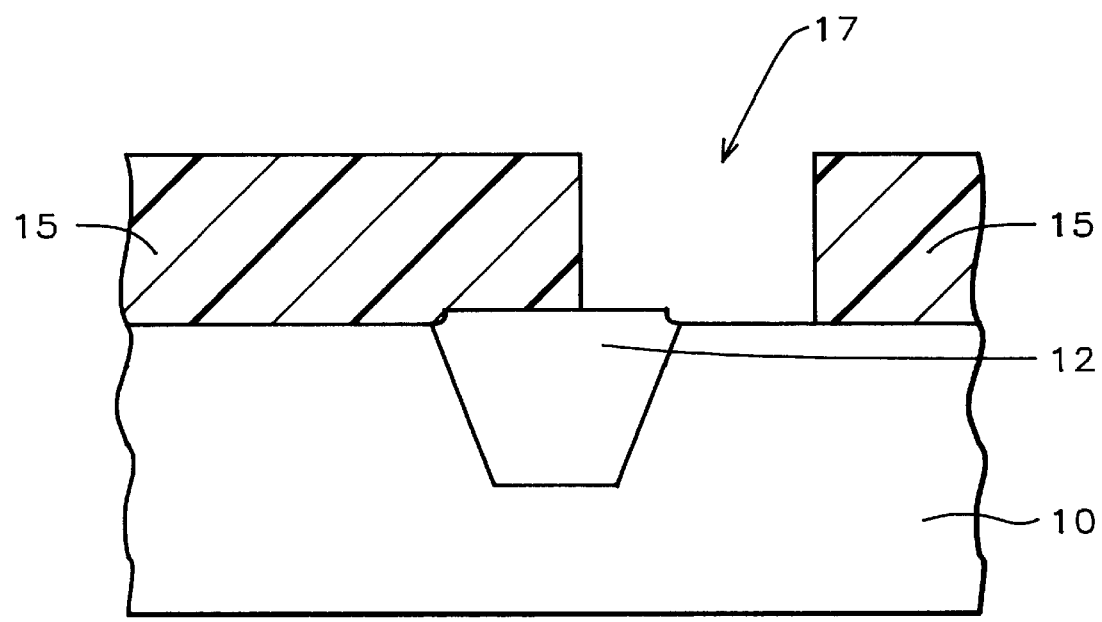

As illustrated in FIGS. 6A and 6B, a layer of photoresist 15 is coated over the substrate. The photoresist mask is formed as is conventional in the art. The opening 17 in the photoresist mask is larger than the butted contact opening by between about 0.15 to 0.20 micron. By way of example, the mask is misaligned slightly, exposing a portion of the STI region 12, as shown in FIG. 6B.

Figure 7A:
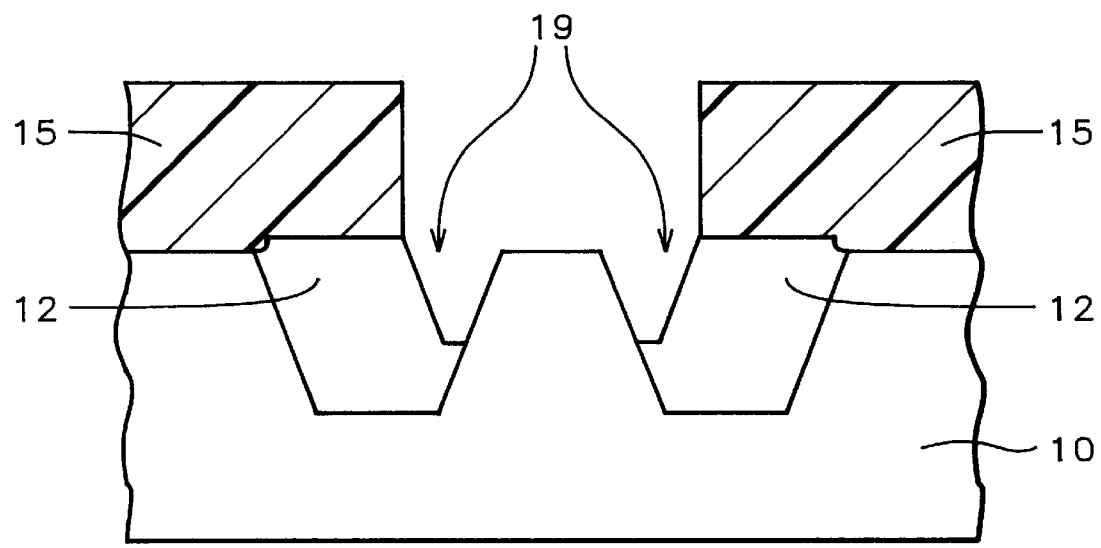
Figure 7B:
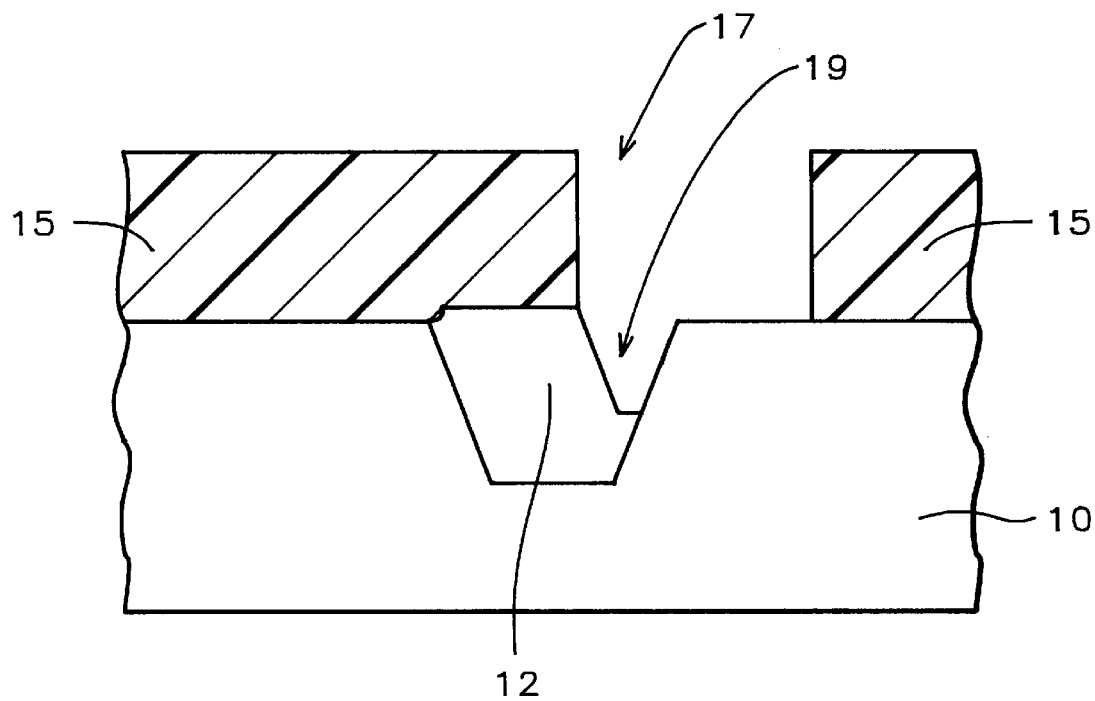

An oxide etch is performed which etches away 1000 to 2000 Angstroms of oxide exposed due to mask misalignment. FIGS. 7A and 7B illustrate trenches 19 etched into the exposed shallow isolation trenches 12.

Next, a gate oxide layer 32 is grown on the surface of the semiconductor substrate to a thickness of between about 40 to 150 Angstroms. The gate oxide also grows on the exposed sidewall of the shallow trench isolation region that is exposed after the oxide is etched away to form trench 19.

Figure 8A:
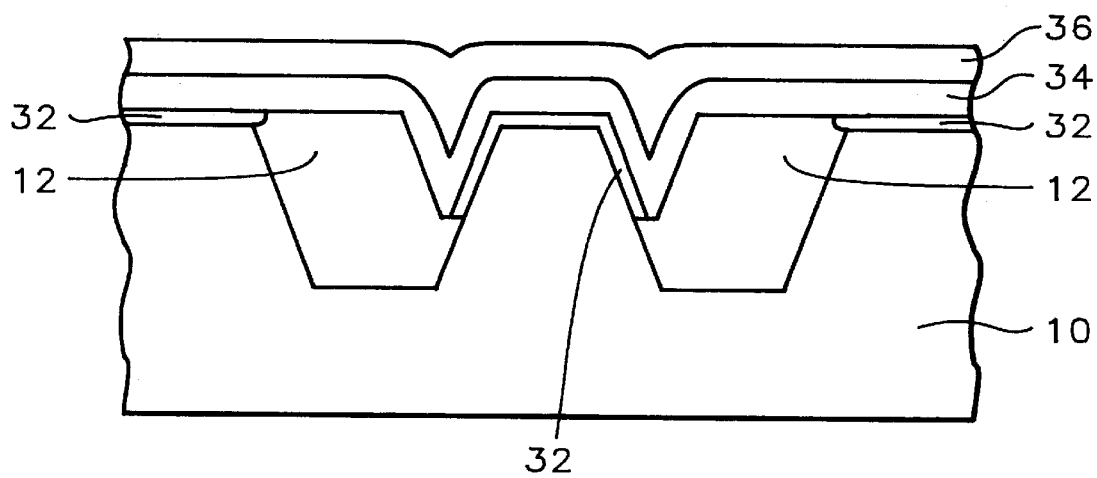
Figure 8B:
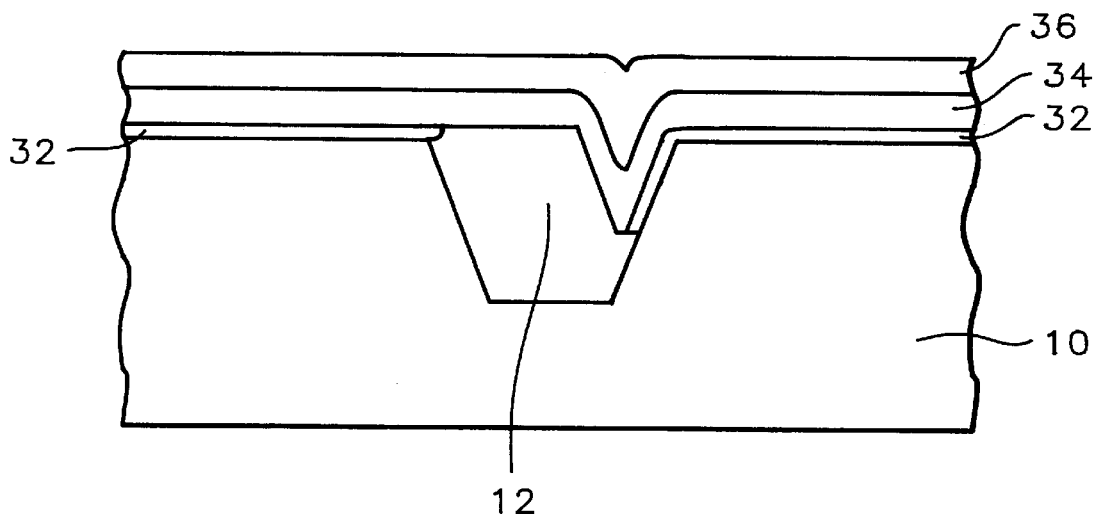

The gate material is now deposited. This may be a polysilicon layer alone or, as illustrated in FIGS. 8A and 8B, a first layer of in-situ doped polysilicon 34 having a thickness of between about 500 to 1500 Angstroms and a second layer of tungsten silicide 36 deposited to a thickness of between about 750 to 1500 Angstroms.

Figure 9A:
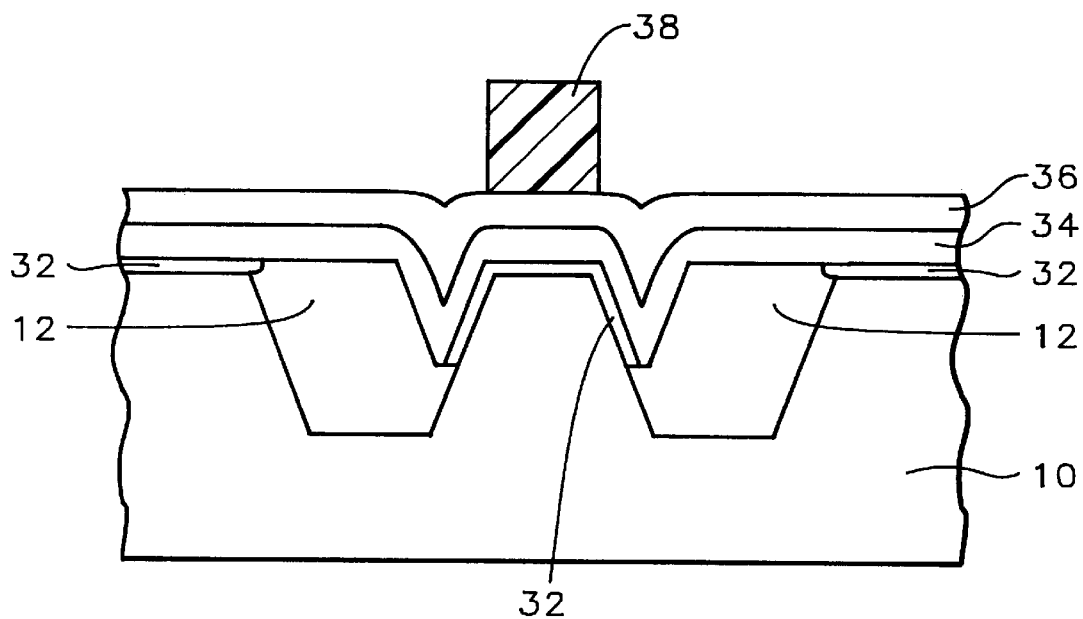
Figure 9B:
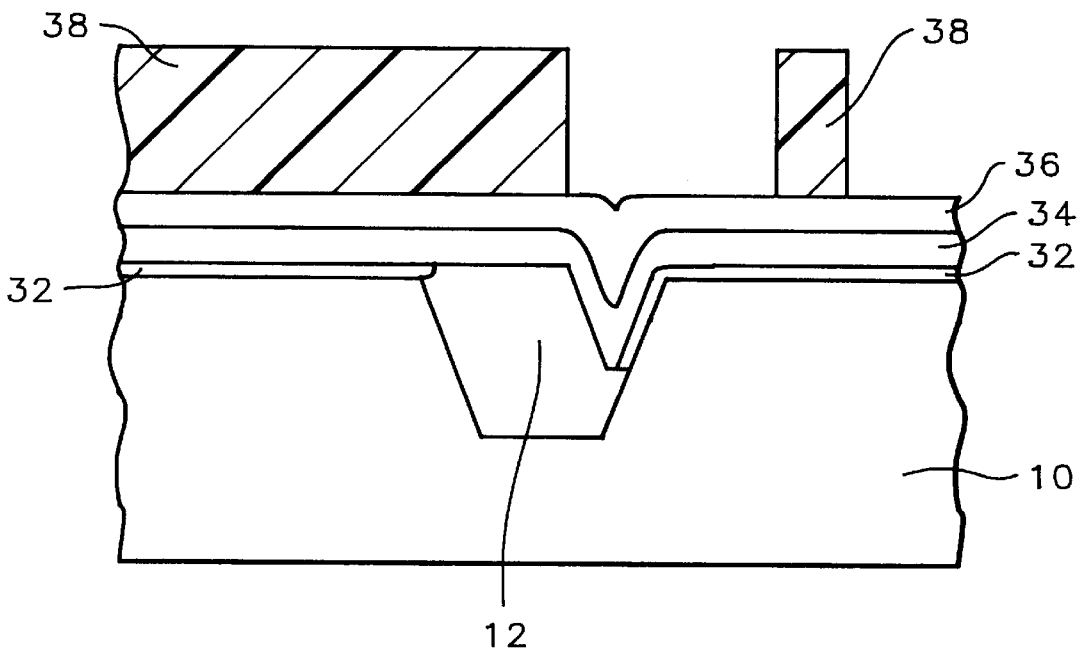
Figure 9C:
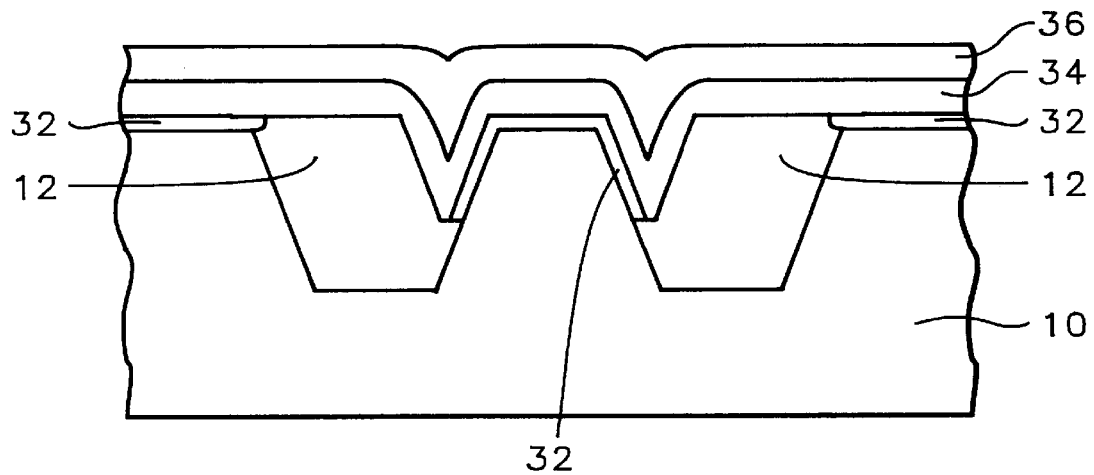
Figure 10A:
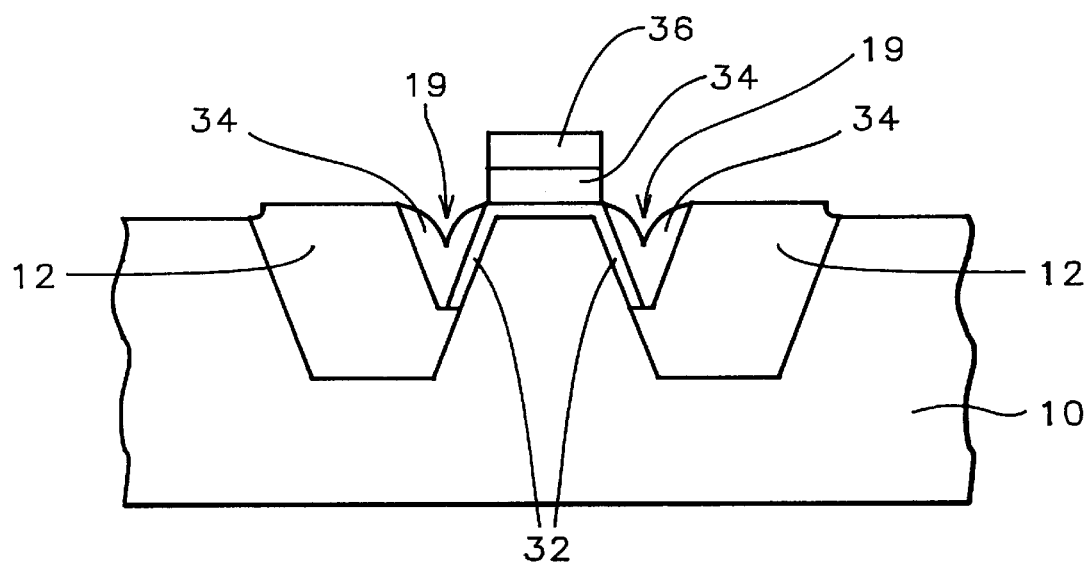
Figure 10B:
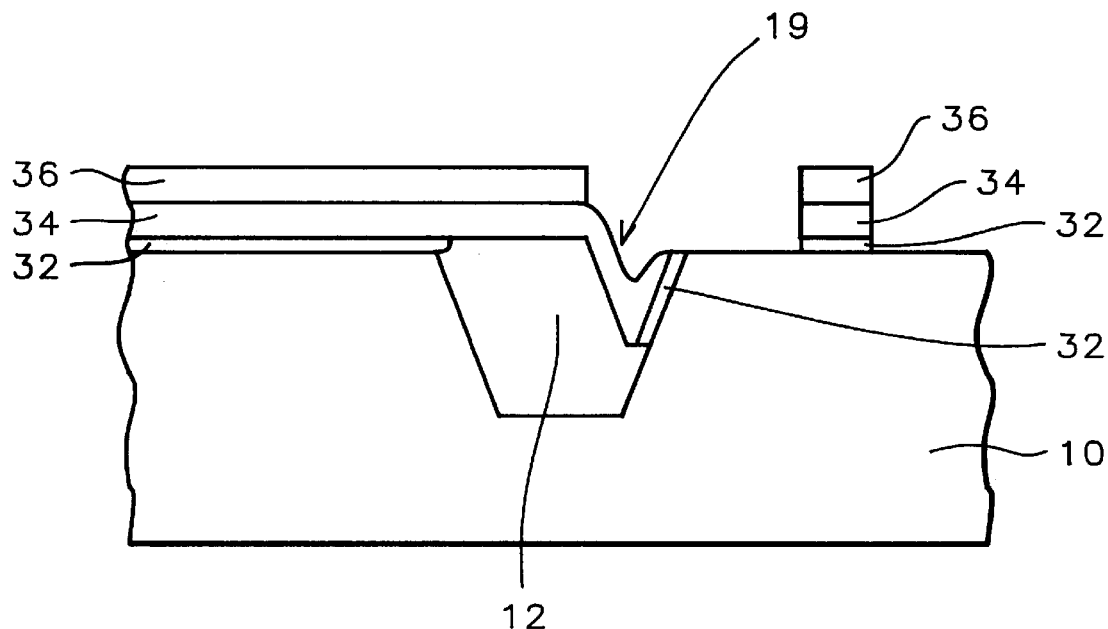
Figure 10C:
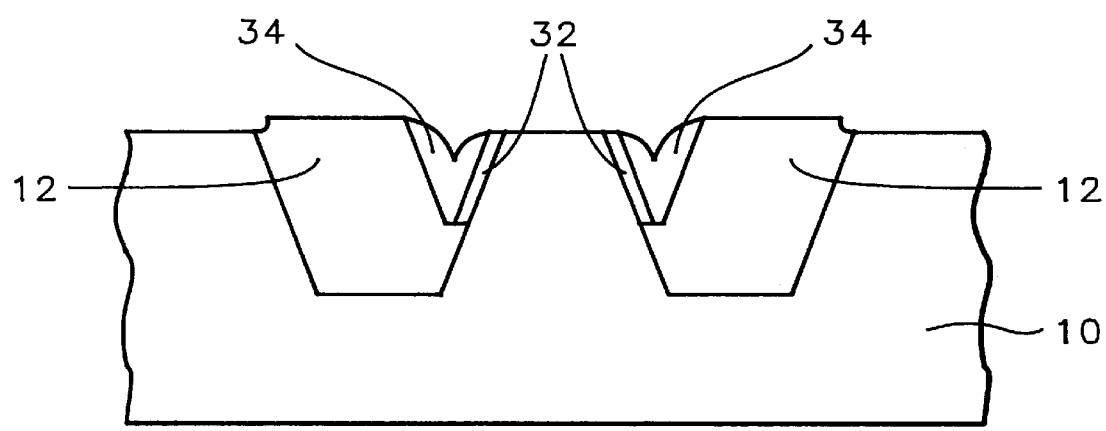

The first level polysilicon areas are defined by a photoresist mask 38, as shown in FIGS. 9A, 9B, and 9C. The mask may be misaligned, as shown in FIG. 9B. Referring now to FIGS. 10A, 10B, and 10C, the gate material 36 and 34 is etched away where it is not covered by the mask 38. After etching, a portion of the polysilicon layer 34 remains within the trenches 19.

Figure 11A:
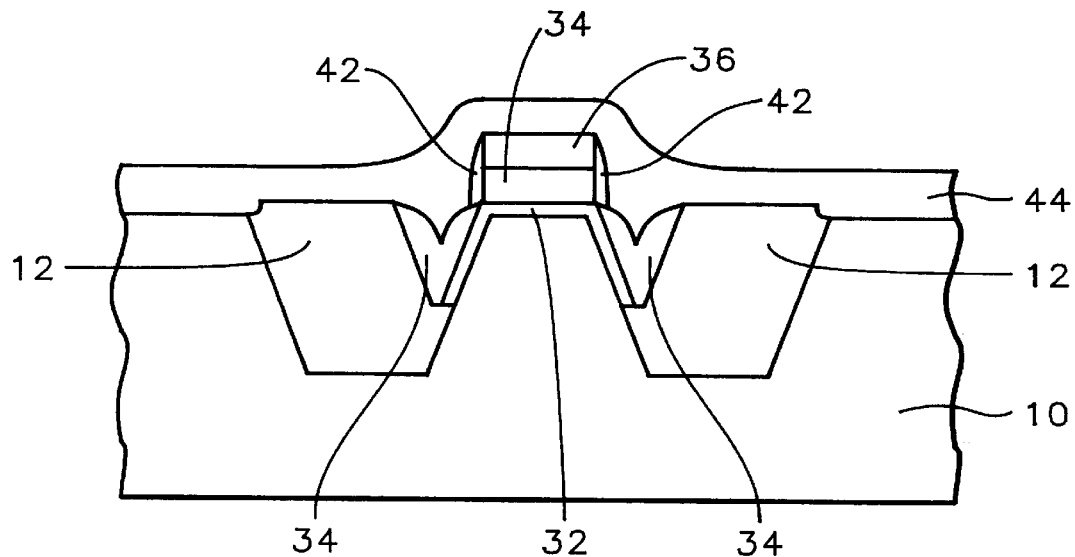
Figure 11B:
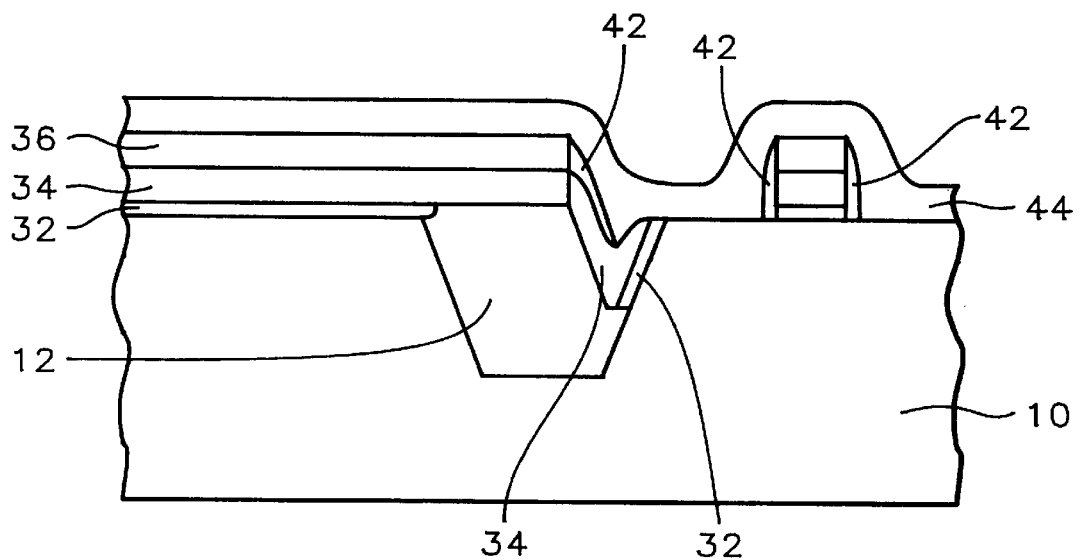
Figure 11C:
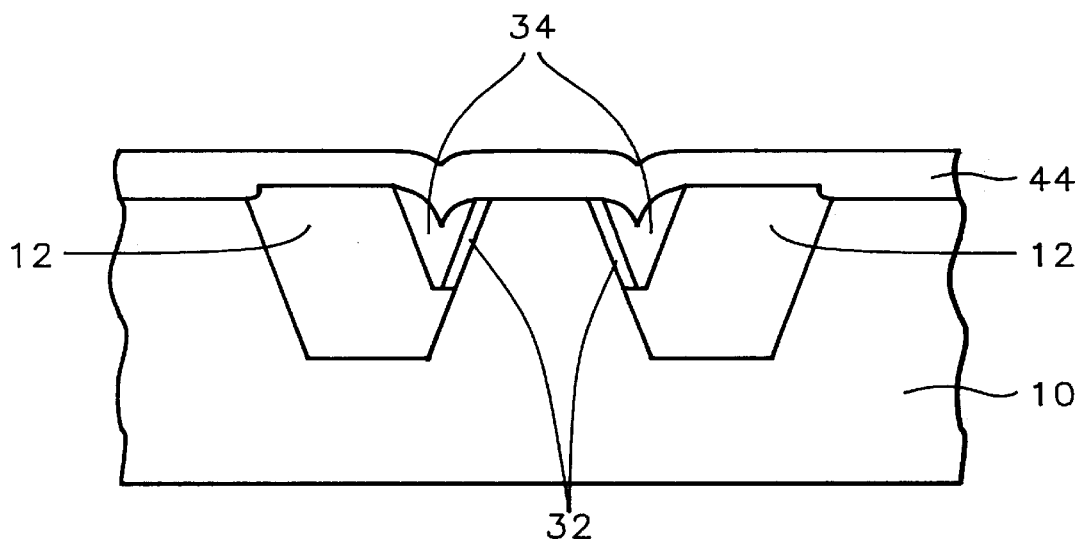

Referring now to FIGS. 11A, 11B, and 11C, source and drain regions 40 are fabricated as is conventional in the art. Sidewall spacers 42 are formed on the sidewalls of the gate and interconnection lines in connection with forming the source/drain regions. Then, an inter-poly oxide layer 44 is deposited over the gate and interconnection lines. The inter-poly oxide may be a tetraethoxysilane (TEOS) oxide deposited by low pressure chemical vapor deposition (CVD) or plasma enhanced CVD to a thickness of between about 1000 and 2000 Angstroms.

Figure 12A:
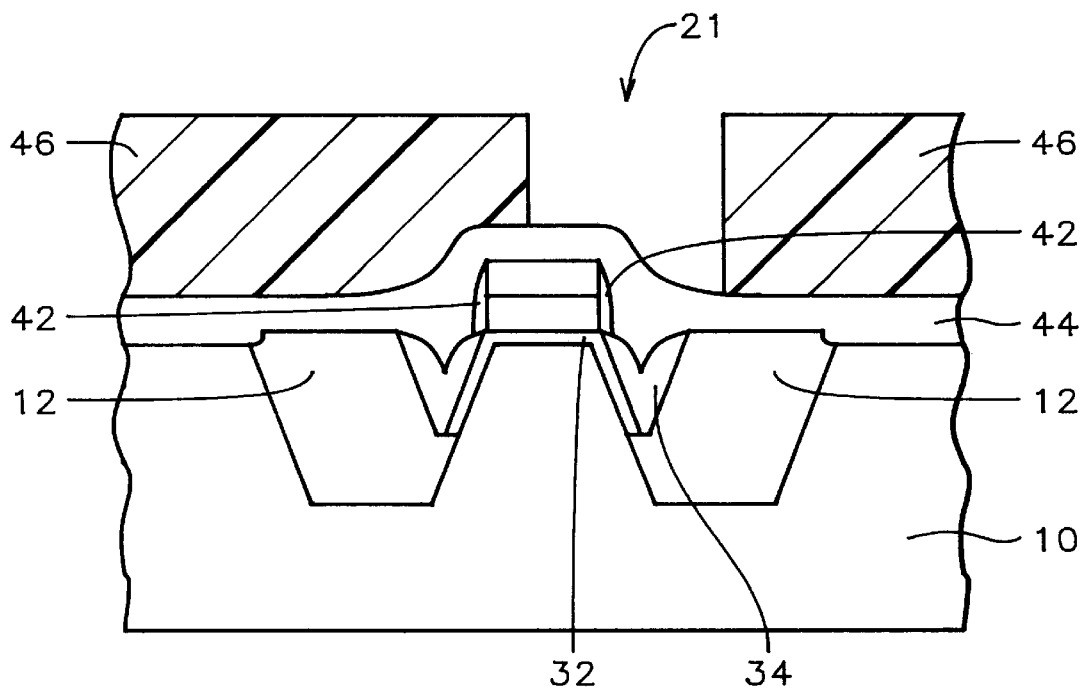
Figure 12B:
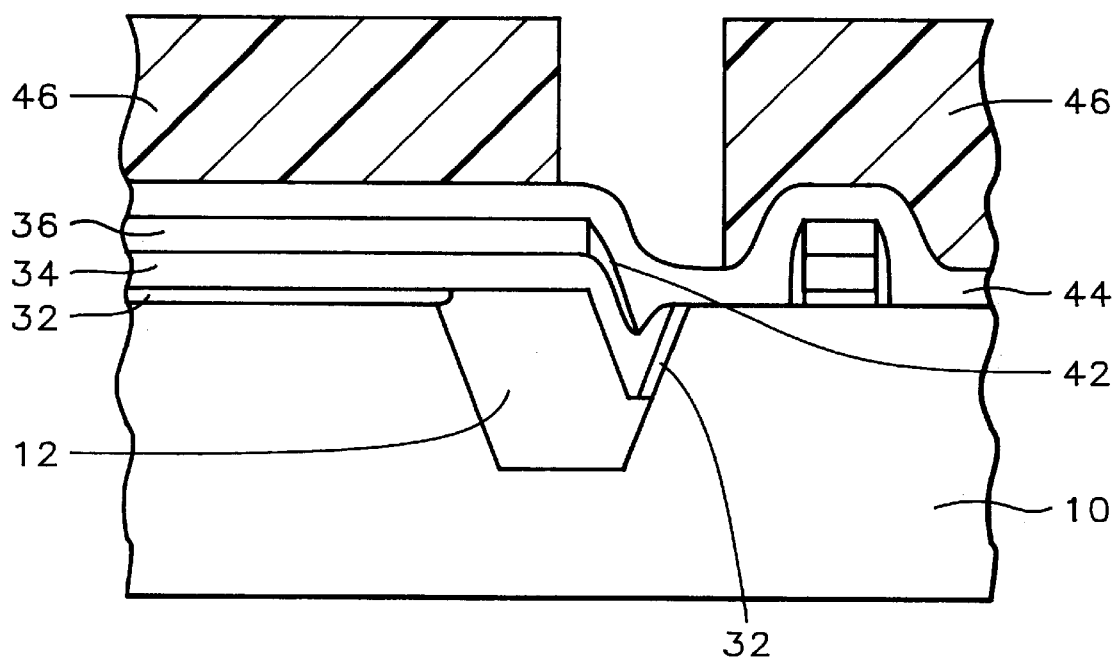
Figure 12C:
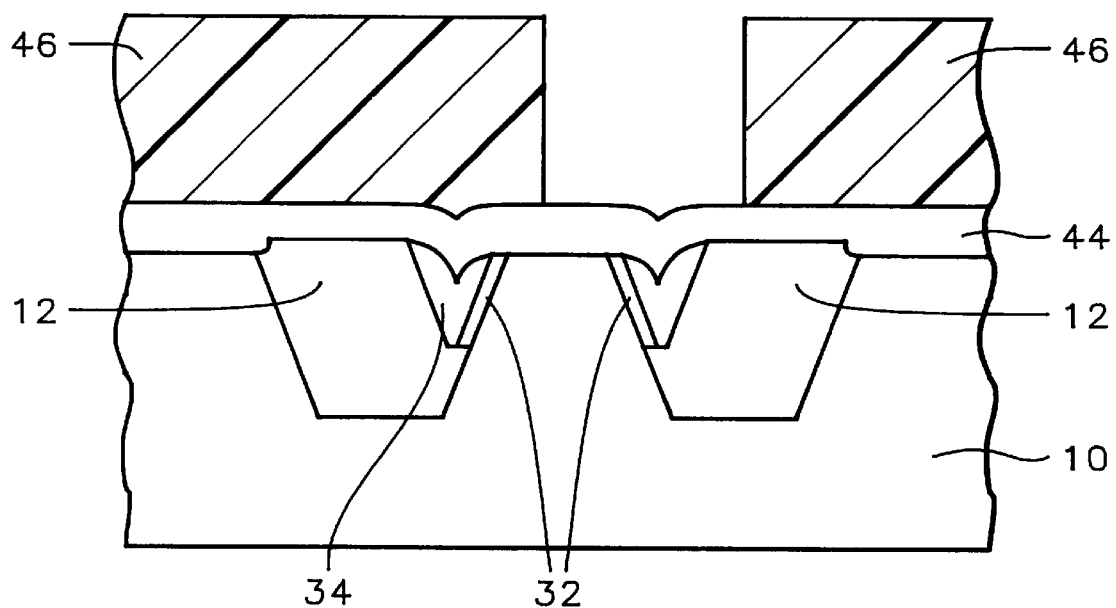
Figure 13A:
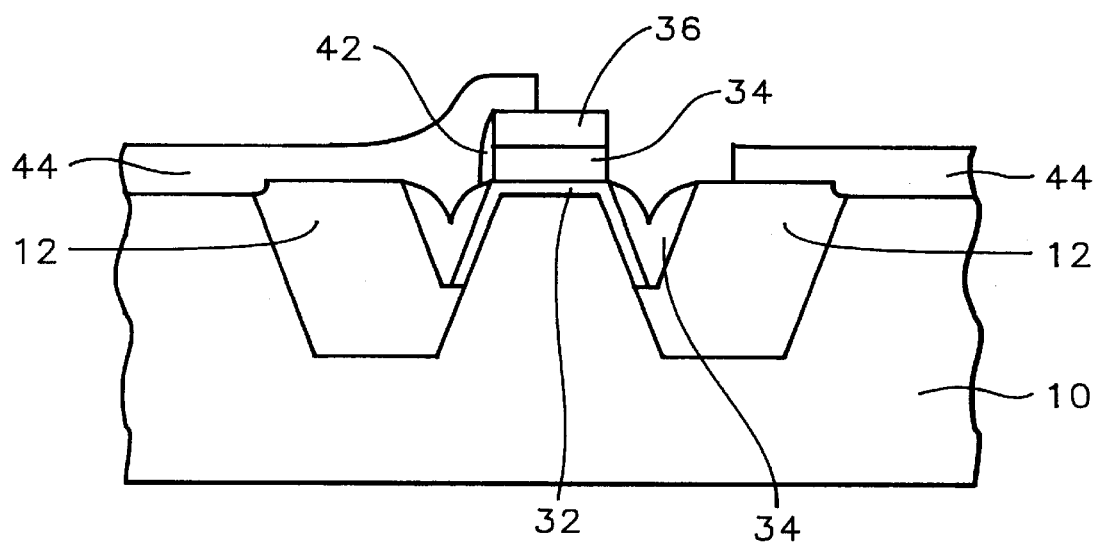
Figure 13B:
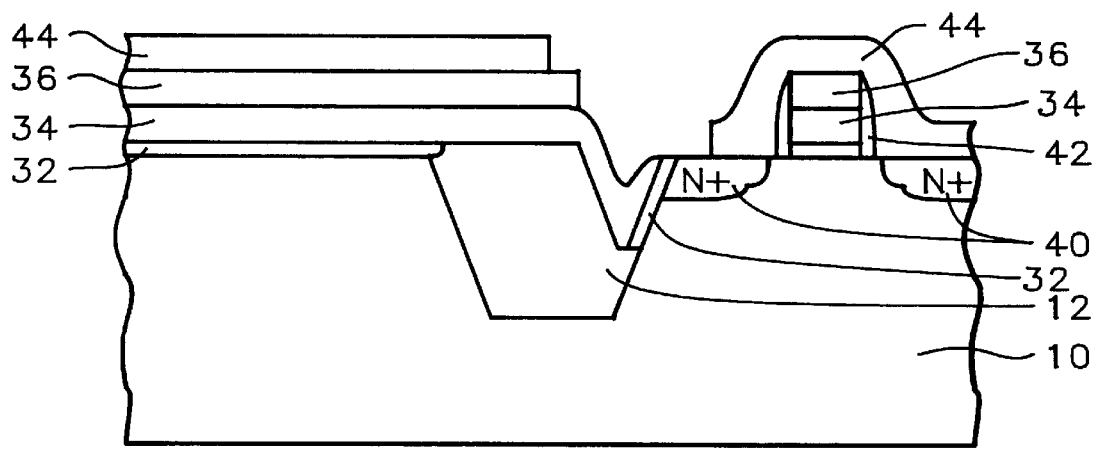
Figure 13C:
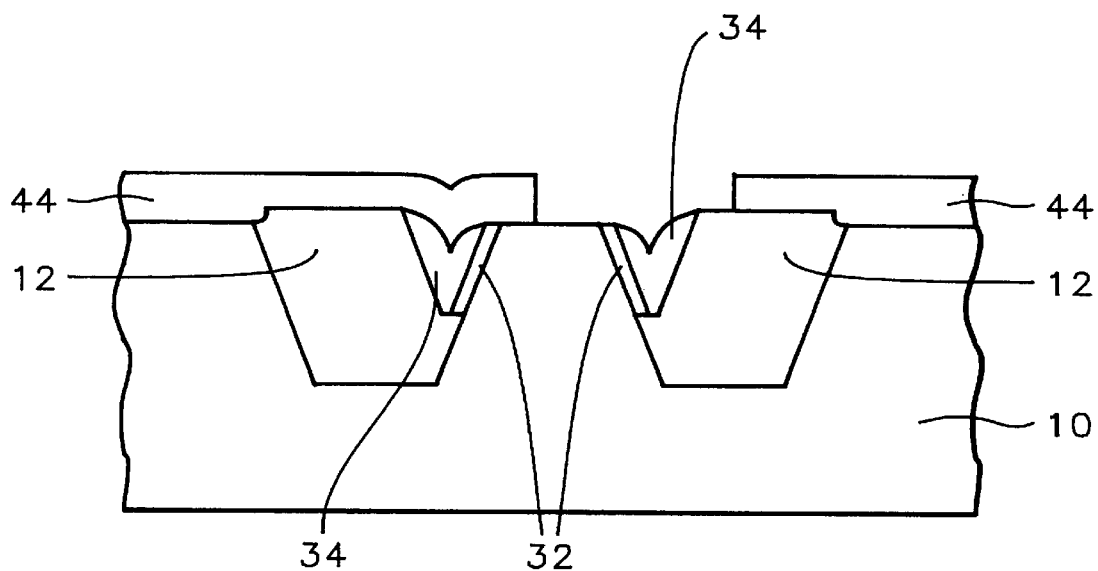

Referring now to FIGS. 12A, 12B, and 12C, the butted contact areas are defined by photoresist mask 46. This mask may be misaligned to the first level polysilicon areas, as shown in FIG. 12B. The oxide 44 is etched away where it is not covered by the mask to provide the butted contact opening, shown in FIGS. 13A, 13B, and 13C.

Figure 14A:
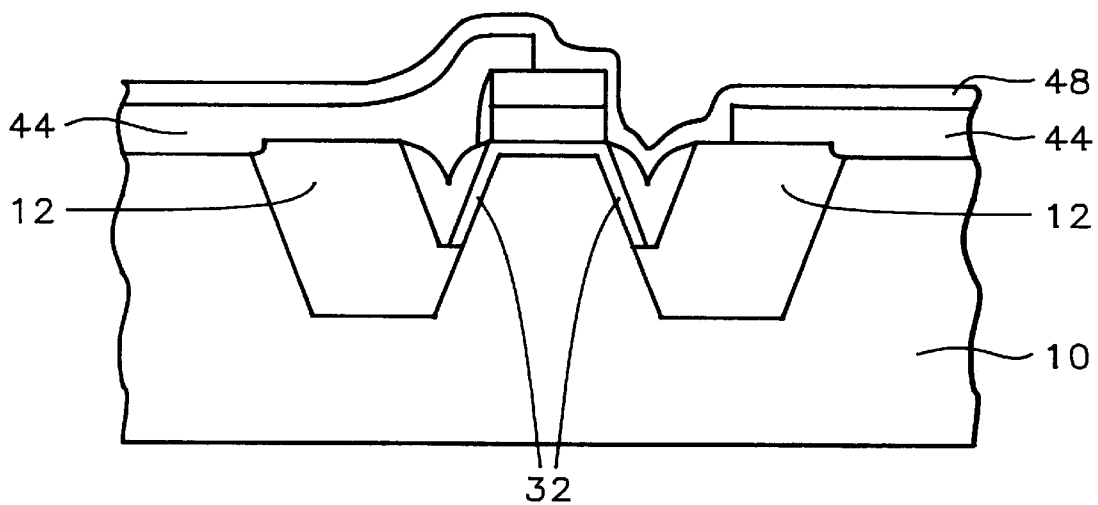
Figure 14B:
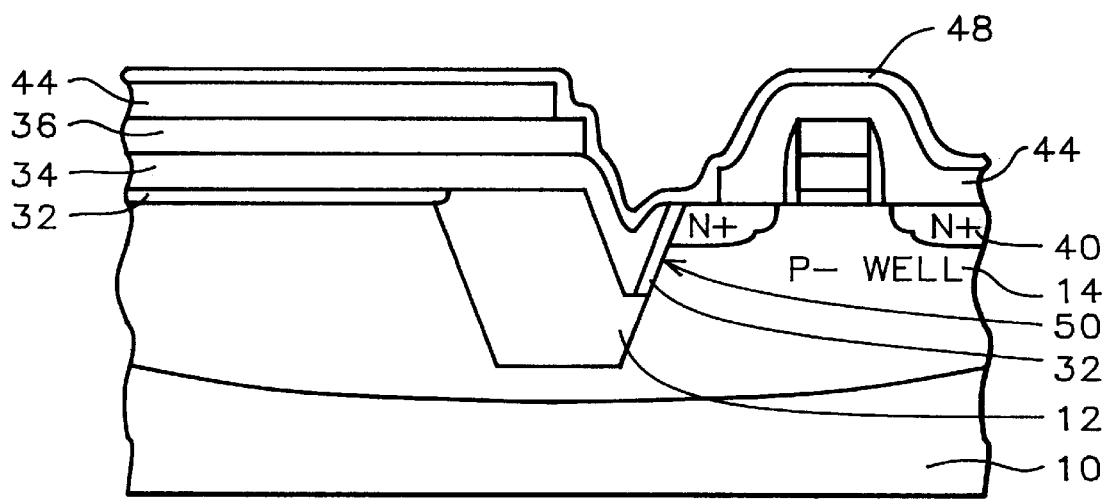
Figure 14C:
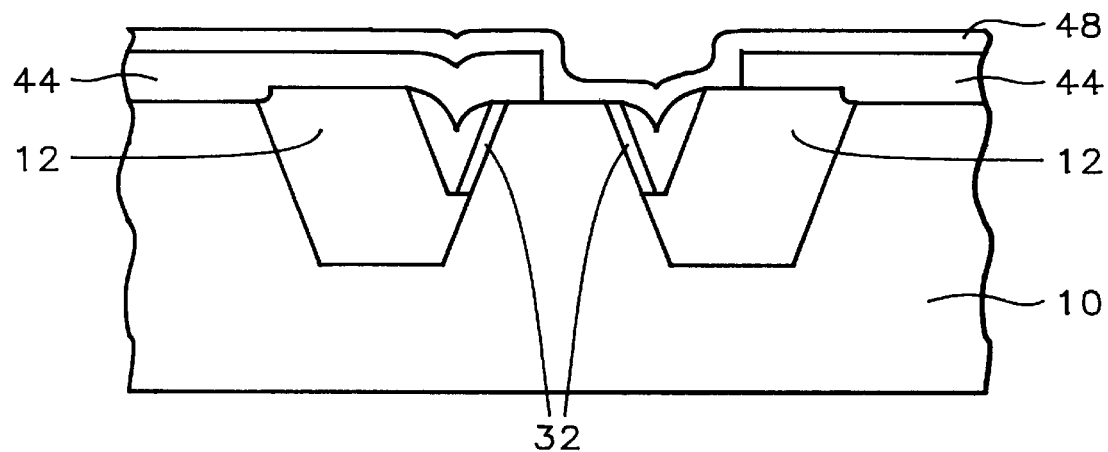

Referring to FIGS. 14A, 14B, and 14C, a second layer of polysilicon 48 is deposited over the inter-poly oxide layer and within the butted contact opening. The gate oxide 32 on the sidewall of the STI trench prevents a short at 50 in FIG. 14B between the polysilicon 34 and the P-well 14, or the semiconductor substrate 10.

Figure 15:
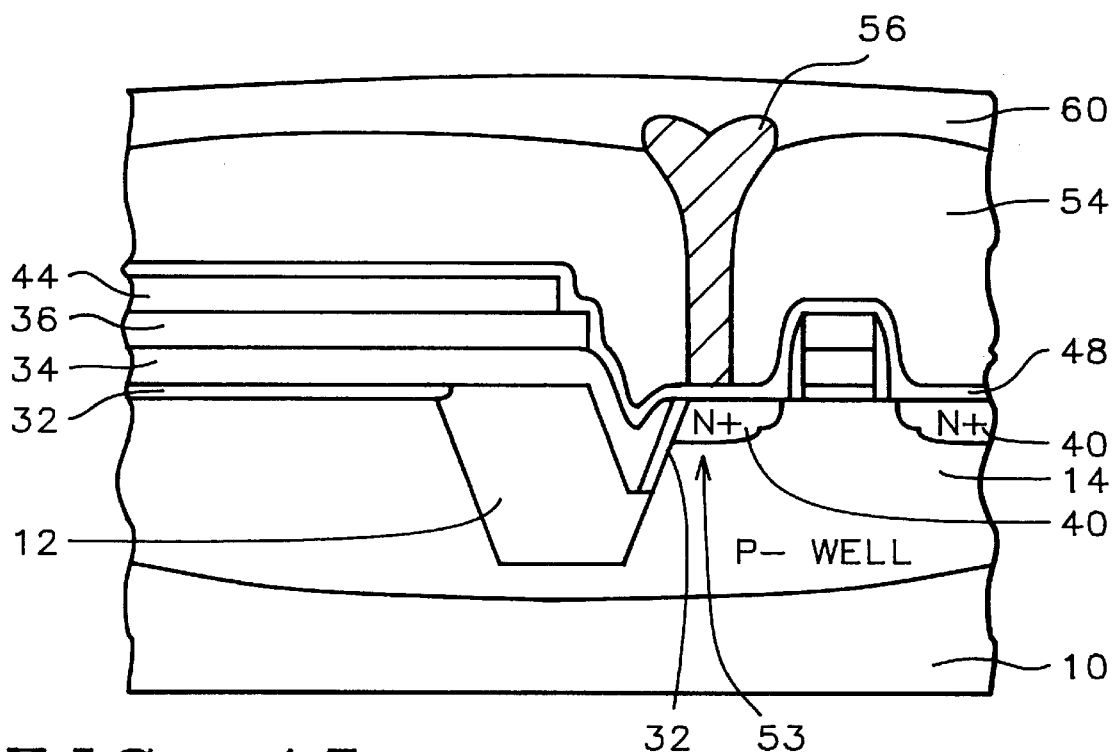
FIG. 15 schematically illustrates in cross-sectional representation a preferred embodiment of this invention for a static random access memory (SRAM).

The present invention can be directly applied to static random access memory (SRAM) butted contacts or to any device utilizing a butt contacted in combination with shallow trench isolation. A completed SRAM is illustrated in FIG. 15. The second polysilicon layer 48 is patterned. Local interconnect implants are performed to reduce sheet resistance. An interlevel dielectric layer 54 is deposited. This may be a layer of plasma enhanced CVD TEOS of 1000 to 2000 Angstroms followed by deposition of borophospho-TEOS of 3000 to 12,000 Angstroms and flow of the BP-TEOS at 750 to 900° C. Metallurgy contacts 56 are defined and deposited followed by passivation 60 to complete fabrication of the integrated circuit device.

Figure 16:
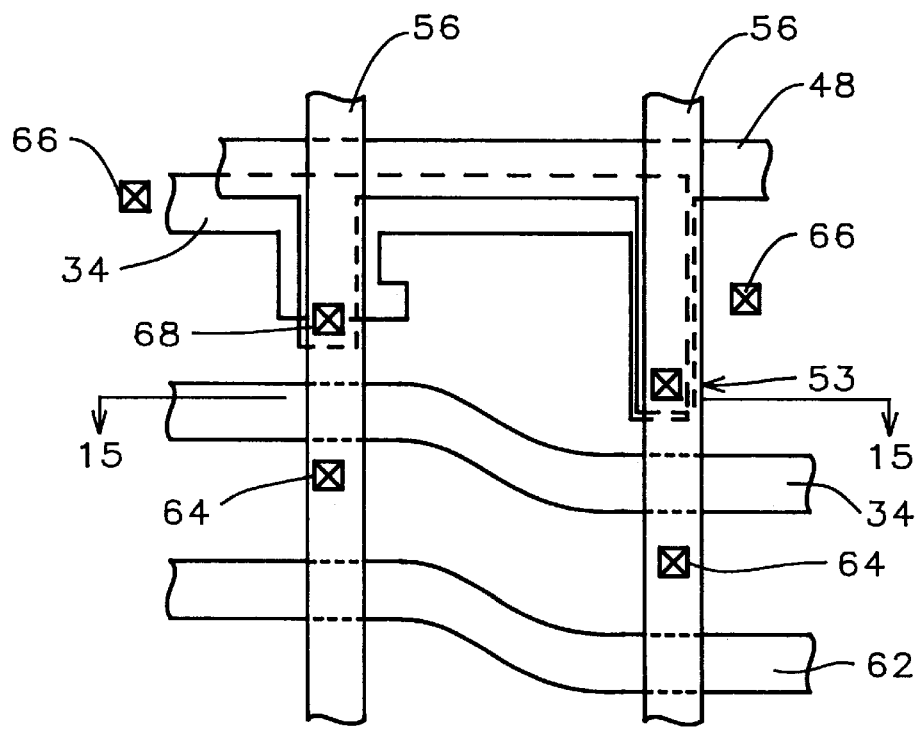
FIG. 16 schematically illustrates in top view a preferred embodiment of this invention for a static random access memory (SRAM).

FIG. 16 is a top view of the completed SRAM integrated circuit device. FIG. 15 shows view 15—15 of FIG. 16 including the butted contact 53. First polysilicon layer 34 (or polycide layer 34/36) is shown, as well as second polysilicon layer 48 is used to make the butted contact between the substrate and the first polysilicon line 34 at 53. Metal lines 56 and bit line 62 are shown. Vss areas 66 and Vcc areas 68 are shown. Butted contact 53 also has a Vcc implant to reduce sheet resistance. Bit line contacts 64 are also shown.

The process of the invention includes an additional extension butted contact photolithographic step and oxide etching before the step of growing the gate oxide. This provides protection for a misalignment trench that may be etched into the shallow trench isolation region. The presence of the gate oxide within the misalignment trench prevents a short between the polysilicon within the trench and the P-well or substrate outside the trench. The process of the invention may be used in fabricated an SRAM device or any other device which uses butted contacts along with shallow trench isolation.

While the invention has been particularly shown and described with reference to the preferred embodiments thereof, it will be understood by those skilled in the art that various changes in form and details may be made without departing from the spirit and scope of the invention.

What is claimed is:

1. A method of forming a butted contact in the fabrication of an integrated circuit wherein active areas of said integrated circuit are separated from one another by shallow trench isolation areas comprising:

providing said shallow trench isolation areas within said semiconductor substrate wherein said shallow trench isolation areas are filled with an oxide;

forming a P-well in said semiconductor substrate in one of said active areas;

forming a first photoresist mask over the surface of said semiconductor substrate having an opening where said butted contact will be formed wherein said opening is larger than said butted contact to be formed and wherein a portion of at least one of said shallow trench isolation areas is exposed;

etching away said oxide within said shallow trench isolation area where it is exposed whereby one sidewall of said at least one of said shallow trench isolation areas is exposed and whereby a misalignment trench is formed within said shallow trench isolation area and wherein said exposed sidewall is adjacent to said P-well;

removing said first photoresist mask;

growing a gate oxide layer on the surface of said semiconductor substrate and on said exposed sidewall of said misalignment trench;

depositing a first polysilicon layer overlying said gate oxide layer and filling said misalignment trench;

forming a second photoresist mask overlying said semiconductor substrate;

etching away said first polysilicon and said gate oxide layers where they are not covered by said second photoresist mask to form gate electrodes and interconnection lines wherein a portion of said first polysilicon layer remains within said misalignment trench and wherein said gate oxide layer on said sidewall is covered by said first polysilicon layer;

removing said second photoresist mask;

forming source and drain regions within said semiconductor substrate adjacent to said gate electrodes;

depositing a first dielectric layer overlying said gate electrodes and interconnection lines;

forming a third photoresist mask overlying said first dielectric layer having an opening where said butted contact is to be made wherein said third photoresist mask is smaller than said first photoresist mask;

etching away said first dielectric layer within said opening;

removing said third photoresist mask; and depositing a second layer of polysilicon over said first dielectric layer and within said opening to form said butted contact wherein the presence of said gate oxide layer within said misalignment trench prevents a short between said first and second polysilicon layers within said misalignment trench and said adjacent P-well completing the formation of said butt contact in the fabrication of said integrated circuit device.

2. The method according to claim 1 wherein said opening of said first photoresist mask is 0.15 to 0.20 micron larger than said butted contact to be formed.

3. The method according to claim 1 wherein said etching away said oxide is performed to a depth of between about 1000 and 2000 Angstroms.

4. The method according to claim 1 wherein said gate oxide layer is grown to a thickness of between about 40 and 150 Angstroms.

5. The method according to claim 1 wherein said first polysilicon layer has a thickness of between about 500 and 1500 Angstroms.

6. The method according to claim 1 further comprising depositing a tungsten silicide layer to a thickness of between about 750 and 1500 Angstroms overlying said first polysilicon layer and wherein said gate electrodes and said interconnection lines comprise said first polysilicon layer and said tungsten silicide layer.

7. The method according to claim 1 wherein said first dielectric layer comprises tetraethoxysilane having a thickness of between about 1000 and 2000 Angstroms.

8. The method according to claim 1 wherein said second polysilicon layer has a thickness of between about 500 and 600 Angstroms.

9. The method according to claim 1 further comprising:

patterning said second polysilicon layer;

depositing a second dielectric layer overlying said patterned second polysilicon layer;

forming contact openings through said second dielectric layer to said patterned second polysilicon layer to be contacted;

depositing and patterning a metal layer within said contact opening; and depositing a passivation layer overlying said patterned metal layer to complete said fabrication of said integrated circuit device.

10. A method of forming a butted contact in the fabrication of an integrated circuit wherein active areas of said integrated circuit are separated from one another by shallow trench isolation areas comprising:

providing said shallow trench isolation areas within said semiconductor substrate wherein said shallow trench isolation areas are filled with an oxide;

forming a first photoresist mask over the surface of said semiconductor substrate having an opening where said butted contact will be formed wherein said opening is larger than said butted contact to be formed and wherein a portion of at least one of said shallow trench isolation areas is exposed;

etching away said oxide within said shallow trench isolation area where it is exposed whereby said semiconductor substrate is exposed at one sidewall of said at least one of said shallow trench isolation areas is exposed and whereby a misalignment trench is formed within said shallow trench isolation area;

removing said first photoresist mask;

growing a gate oxide layer on the surface of said semiconductor substrate and on said exposed sidewall of said misalignment trench;

depositing a first polysilicon layer overlying said gate oxide layer and filling said misalignment trench;

forming a second photoresist mask overlying said semiconductor substrate;

etching away said first polysilicon and said gate oxide layers where they are not covered by said second photoresist mask to form gate electrodes and interconnection lines wherein a portion of said first polysilicon layer remains within said misalignment trench and wherein said gate oxide layer on said sidewall is covered by said first polysilicon layer;

removing said second photoresist mask;

forming source and drain regions within said semiconductor substrate adjacent to said gate electrodes;

depositing a first dielectric layer overlying said gate electrodes and interconnection lines;

forming a third photoresist mask overlying said first dielectric layer having an opening where said butted contact is to be made wherein said third photoresist mask is smaller than said first photoresist mask;

etching away said first dielectric layer within said opening;

removing said third photoresist mask; and depositing a second layer of polysilicon over said first dielectric layer and within said opening to form said butted contact wherein the presence of said gate oxide layer within said misalignment trench prevents a short between said first and second polysilicon layers within said misalignment trench and said exposed semiconductor substrate at said sidewall of said shallow trench isolation area completing the formation of said butt contact in the fabrication of said integrated circuit device.

11. The method according to claim 10 wherein said opening of said first photoresist mask is 0.15 to 0.20 micron larger than said butted contact to be formed.

12. The method according to claim 10 wherein said etching away said oxide is performed to a depth of between about 1000 and 2000 Angstroms.

13. The method according to claim 10 wherein said gate oxide layer is grown to a thickness of between about 40 and 150 Angstroms.

14. The method according to claim 10 wherein said first polysilicon layer has a thickness of between about 500 and 1500 Angstroms.

15. The method according to claim 10 further comprising depositing a tungsten silicide layer to a thickness of between about 750 and 1500 Angstroms overlying said first polysilicon layer and wherein said gate electrodes and said interconnection lines comprise said first polysilicon layer and said tungsten silicide layer.

16. The method according to claim 10 wherein said first dielectric layer comprises tetraethoxysilane having a thickness of between about 1000 and 2000 Angstroms.

17. The method according to claim 10 wherein said second polysilicon layer has a thickness of between about 500 and 600 Angstroms.

18. The method according to claim 10 further comprising:

patterning said second polysilicon layer;

depositing a second dielectric layer overlying said patterned second polysilicon layer;

forming contact openings through said second dielectric layer to said patterned second polysilicon layer to be contacted;

depositing and patterning a metal layer within said contact opening; and depositing a passivation layer overlying said patterned metal layer to complete said fabrication of said integrated circuit device.

19. A method of forming a butted contact in the fabrication of an integrated circuit wherein active areas of said integrated circuit are separated from one another by shallow trench isolation areas comprising:

providing said shallow trench isolation areas within said semiconductor substrate wherein said shallow trench isolation areas are filled with an oxide;

forming a first photoresist mask over the surface of said semiconductor substrate having an opening where said butted contact will be formed wherein said opening is larger than said butted contact to be formed and wherein a portion of at least one of said shallow trench isolation areas is exposed;

etching away said oxide within said shallow trench isolation area where it is exposed whereby said semiconductor substrate is exposed at one sidewall of said at least one of said shallow trench isolation areas and whereby a misalignment trench is formed within said shallow trench isolation area;

removing said first photoresist mask;

growing a gate oxide layer on the surface of said semiconductor substrate and on said exposed sidewall of said misalignment trench;

depositing a first polysilicon layer overlying said gate oxide layer and filling said misalignment trench;

etching away said first polysilicon and said gate oxide layers to form gate electrodes and interconnection lines wherein a portion of said first polysilicon layer remains within said misalignment trench and wherein said gate oxide layer on said sidewall is covered by said first polysilicon layer;

depositing a first dielectric layer overlying said gate electrodes and interconnection lines;

forming a second photoresist mask overlying said first dielectric layer having an opening where said butted contact is to be made wherein said second photoresist mask is smaller than said first photoresist mask;

etching away said first dielectric layer within said opening;

removing said second photoresist mask;

depositing a second layer of polysilicon over said first dielectric layer and within said opening to form said butted contact wherein the presence of said gate oxide layer within said misalignment trench prevents a short between said first and second polysilicon layers within said misalignment trench and said exposed semiconductor substrate at said sidewall of said shallow trench isolation area;

patterning said second polysilicon layer;

depositing a second dielectric layer overlying said patterned second polysilicon layer;

forming contact openings through said second dielectric layer to said patterned second polysilicon layer to be contacted;

depositing and patterning a metal layer within said contact opening; and depositing a passivation layer overlying said patterned metal layer completing the formation of said butt contact in the fabrication of said integrated circuit device.

20. The method according to claim 19 wherein said opening of said first photoresist mask is 0.15 to 0.20 micron larger than said butted contact to be formed.

* * * * *